United States Patent
Ko et al.

(10) Patent No.: US 9,761,777 B2
(45) Date of Patent: Sep. 12, 2017

(54) THERMOELECTRIC MATERIALS

(71) Applicant: LG CHEM, LTD., Seoul (KR)

(72) Inventors: Kyung-Moon Ko, Daejeon (KR);
Tae-Hoon Kim, Daejeon (KR);
Cheol-Hee Park, Daejeon (KR);
Jae-Ki Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/440,065

(22) PCT Filed: Sep. 5, 2014

(86) PCT No.: PCT/KR2014/008405
§ 371 (c)(1),
(2) Date: Apr. 30, 2015

(87) PCT Pub. No.: WO2015/034318
PCT Pub. Date: Mar. 12, 2015

(65) Prior Publication Data
US 2016/0181497 A1  Jun. 23, 2016

(30) Foreign Application Priority Data

Sep. 9, 2013 (KR) .................. 10-2013-0107927
Jul. 21, 2014 (KR) .................. 10-2014-0091973
Sep. 4, 2014 (KR) .................. 10-2014-0117862

(51) Int. Cl.
*H01L 35/14* (2006.01)
*H01L 35/16* (2006.01)
*H01L 35/34* (2006.01)

(52) U.S. Cl.
CPC .............. *H01L 35/16* (2013.01); *H01L 35/34* (2013.01)

(58) Field of Classification Search
CPC .......... H01L 35/16; H01L 35/00; H01L 35/34
See application file for complete search history.

(56) References Cited

U.S. PATENT DOCUMENTS

| | | |
|---|---|---|
| 2011/0139208 A1 | 6/2011 | Lee et al. |
| 2012/0085977 A1 | 4/2012 | Murai et al. |
| 2013/0319495 A1 | 12/2013 | Kim et al. |
| 2016/0059313 A1 | 3/2016 | Tang et al. |

FOREIGN PATENT DOCUMENTS

| | | |
|---|---|---|
| CN | 101333645 A | 12/2008 |
| CN | 102674270 A | 9/2012 |
| JP | 2011-003741 A | 1/2011 |
| JP | 2012-094590 A | 5/2012 |
| KR | 10-2009-0110831 A | 10/2009 |
| KR | 10-2011-0052225 A | 5/2011 |

(Continued)

OTHER PUBLICATIONS

Xiao Jingjing, Preparation and Thermoelectric Properties of Cu_2Se Based Compounds, Chinese Master's Thesis Full-text Database, pp. 40-48, Sep. 15, 2011.*

(Continued)

*Primary Examiner* — Carol M Koslow

(57) ABSTRACT

Disclosed is a thermoelectric conversion material having excellent performance. The thermoelectric material according to the present disclosure includes a matrix including Cu and Se, and Cu-containing particles.

16 Claims, 20 Drawing Sheets

(56) References Cited

FOREIGN PATENT DOCUMENTS

| KR | 10-2012-0086190 A | 8/2012 |
|---|---|---|
| TW | 2005-26914 A | 8/2005 |
| WO | WO 2008/140596 A2 | 11/2008 |
| WO | WO 2011/094635 A2 | 8/2011 |
| WO | WO 2012/102523 A2 | 8/2012 |
| WO | WO 2014/146485 A1 | 9/2014 |

OTHER PUBLICATIONS

Xiao Jingjing, "Preparation and Thermoelectric Properties of Cu_2Se Based Compounds", Chinese Master's Theses Full-text Database, Sep. 15, 2011, pp. 40-48.

Yunxiang Hu et al., "Deposition of copper selenide thin films and nanoparticles", Journal of Crystal Growth, Oct. 13, 2006, pp. 61-65, vol. 297, Elsevier.

International Search Report for PCT/KR2014/008405 filed on Sep. 5, 2014.

Xiao Xing-Xing et al., "Phase transition and high temperature thermoelectric properties of copper selenide $Cu_{2-x}Se$ ($0 \leq x \leq 0.25$)*", Chinese Physics B, 2011, pp. 087201-1-087201-8, vol. 20, No. 8, Chinese Physical Society and IOP Publishing Ltd.

S.A. Danilkin et al., "Crystal structure and lattice dynamics of superionic copper selenide $Cu_{2-\delta}Se$", Journal of Alloys and Compounds, 2003, pp. 57-61, vol. 361, Elsevier B.V.

T. Takahashi et al., "Ionic Conductivity and Coulometric Titration of Copper Selenide", Journal of Solid State Chemistry, 1976, pp. 35-39, vol. 16, Academic Press, Inc, Great Britain.

Extended European Search Report for European Application No. 14841837.9 dated Jun. 21, 2016.

Extended European Search Report for European Application No. 14841933.6 dated Jun. 21, 2016.

Extended European Search Report for European Application No. 14842225.6 dated Jun. 21, 2016.

Huili Liu et al.,"Copper ion liquid-like thermoelectrics", Nature Materials, May 2012, p. 422-425, vol. 11, Macmillan Publishers Limited.

Bo Yu et al., "Thermoelectric properties of copper selenide with ordered selenium layer and disordered copper layer", Nano Energy, Mar. 7, 2012, p. 472-478, vol. 1, Elsevier Ltd.

Ch. Raju et al., "Thermoelectric properties of chalcogenide based $Cu_{2-x}ZnSn_{1-x}Se_4$,", AIP Advances, Mar. 1, 2013, pp. 032106-1-032106-12, vol. 3, AIP Publishing.

Xiao Xingxing, "Preparation and Thermoelectric Properties of Cu_2Se Based Compounds", Chinese Master's Theses Full-text Database, pp. 17-18, Dec. 31, 2011.

Xiao Xingxing, "Preparation and Thermoelectric Properties of Cu_2Se Based Compounds", Master's Theses ofWuhan University of Technology, pp. 18-20, 36, and 43, Sep. 15, 2011.

* cited by examiner

THERMOELECTRIC MATERIALS

TECHNICAL FIELD

The present disclosure relates to thermoelectric conversion technology, and more particularly, to a thermoelectric conversion material with excellent thermoelectric conversion properties and its manufacturing method.

The present application claims priority to Korean Patent Application No. 10-2013-0107927 filed on Sep. 9, 2013 in the Republic of Korea, Korean Patent Application No. 10-2014-0091973 filed on Jul. 21, 2014 in the Republic of Korea, and Korean Patent Application No. 10-2014-0117862 filed on Sep. 4, 2014 in the Republic of Korea, the disclosures of which are incorporated herein by reference.

BACKGROUND ART

A compound semiconductor is a compound that is composed of at least two types of elements rather than one type of element such as silicon or germanium and operates as a semiconductor. Various types of compound semiconductors have been developed and are currently being used in various fields of industry. Typically, a compound semiconductor may be used in thermoelectric conversion elements using the Peltier Effect, light emitting devices using the photoelectric conversion effect, for example, light emitting diodes or laser diodes, fuel cells, and the like.

Particularly, a thermoelectric conversion element is used for thermoelectric conversion power generation or thermoelectric conversion cooling applications, and generally includes an N-type thermoelectric semiconductor and a P-type thermoelectric semiconductor electrically connected in series and thermally connected in parallel. The thermoelectric conversion power generation is a method which generates power by converting thermal energy to electrical energy using a thermoelectromotive force generated by creating a temperature difference in a thermoelectric conversion element. Also, the thermoelectric conversion cooling is a method which produces cooling by converting electrical energy to thermal energy using an effect that a temperature difference creates between both ends of a thermoelectric conversion element when a direct current flows through the both ends of the thermoelectric conversion element.

The energy conversion efficiency of the thermoelectric conversion element generally depends on a performance index value or ZT of a thermoelectric conversion material. Here, the ZT may be determined based on the Seebeck coefficient, electrical conductivity, and thermal conductivity, and as a ZT value increases, a thermoelectric conversion material has better performance.

Many thermoelectric materials available for a thermoelectric conversion element have been now proposed and developed, and among them, $Cu_xSe$ ($x \leq 2$) was proposed as a Cu—Se based thermoelectric material and is being developed. This is because $Cu_xSe$ ($x \leq 2$) is known.

Particularly, it has been recently reported that a relatively low thermal conductivity and a high ZT value was achieved in $Cu_xSe$ ($1.98 \leq x \leq 2$). Typically, Lidong Chen group has reported that $Cu_2Se$ exhibited ZT=1.5 at 727° C. (Nature Materials, 11, (2012), 422-425). Also, Gang Chen group of MIT has reported a high ZT value at $x=1.96(Cu_2Se_{1.02})$ and $x=1.98(Cu_2Se_{1.01})$ (x is less than 2) (Nano Energy (2012) 1, 472-478).

However, seeing both of the two results, a comparatively good ZT value was observed at 600° C.~727° C., but a ZT value was found very low at the temperature lower than or equal to 600° C. Even though a thermoelectric material has a high ZT at a high temperature, if the thermoelectric material has a low ZT value at a low temperature, such a thermoelectric material is not preferred, in particular, unsuitable for a thermoelectric material for power generation. Even if such a thermoelectric material is applied to a heat source of high temperature, a certain region of the material is subjected to a temperature much lower than a desired temperature due to a temperature gradient in the material itself. Therefore, there is a need to develop a thermoelectric material capable of maintaining a high ZT value over a broad temperature range due to having a high ZT value in a temperature range lower than or equal to 600° C., for example, 100° C.~600° C., as well as in a temperature range higher than 600° C.

DISCLOSURE

Technical Problem

Accordingly, the present disclosure is designed to solve the above problem, and therefore, the present disclosure is directed to providing a thermoelectric material having high thermoelectric conversion performance over a broad temperature range and its manufacturing method.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

To achieve the above object, a thermoelectric material according to the present disclosure includes a matrix including Cu and Se, and Cu-containing particles.

Preferably, the Cu-containing particles may be an induced nano-dot (INDOT).

Also, preferably, the Cu-containing particles may include at least one of Cu particles and $Cu_2O$ particles.

Also, preferably, the matrix may include a plurality of grains, and the Cu-containing particles may be disposed at a grain boundary in the matrix.

Also, preferably, at least some of the Cu-containing particles may aggregate with each other.

Also, preferably, the matrix may be represented by a chemical formula $Cu_xSe$, where x is a positive rational number.

Also, preferably, the matrix may include $Cu_2Se$.

Also, preferably, the thermoelectric material according to the present disclosure may be manufactured by a manufacturing method including forming a mixture by weighing Cu and Se based on the following chemical formula 1 and mixing Cu and Se, and forming a compound by thermally treating the mixture:

$$Cu_xSe \qquad \text{<Chemical Formula 1>}$$

where x is a positive rational number.

Also, preferably, in the chemical formula 1, $2 < x \leq 2.6$.

Also, preferably, the manufacturing method may further include pressure sintering the compound after forming the compound.

Also, preferably, the Cu-containing particles may be spontaneously formed during the sintering.

Also, preferably, the forming of the mixture may include mixing Cu and Se in powder form.

Also, preferably, the forming of the compound may be performed by a solid state reaction method.

Also, preferably, the thermoelectric material according to the present disclosure may be represented by the chemical formula 1, where x is a positive rational number, in particular, $2 < x \leq 2.6$.

Also, to achieve the above object, a thermoelectric conversion element according to the present disclosure includes the thermoelectric material according to the present disclosure.

Also, to achieve the above object, a thermoelectric power generator according to the present disclosure includes the thermoelectric material according to the present disclosure.

Advantageous Effects

According to the present disclosure, a thermoelectric material having excellent thermoelectric conversion performance may be provided.

Particularly, the thermoelectric material according to one aspect of the present disclosure may have a low thermal diffusivity and a low thermal conductivity and a high Seebeck coefficient and a high ZT value in a broad temperature range between 100° C. and 600° C.

Accordingly, the thermoelectric material according to the present disclosure may replace a traditional thermoelectric material, or may be used as another material in conjunction with a traditional thermoelectric material.

Moreover, the thermoelectric material according to the present disclosure may maintain a ZT value higher than a traditional thermoelectric material at a temperature lower than or equal to 600° C., to be more concrete, at a low temperature close to 100° C.~200° C. Thus, when used in a thermoelectric device for power generation, the thermoelectric material according to the present disclosure may ensure stable thermoelectric conversion performance even if the material is exposed to a comparatively low temperature.

Also, the thermoelectric material according to the present disclosure may be used in a solar cell, an infrared (IR) window, an IR sensor, a magnetic device, a memory, and the like.

BRIEF DESCRIPTION OF THE DRAWINGS

The accompanying drawings illustrate a preferred embodiment of the present disclosure and together with the foregoing disclosure, serve to provide further understanding of the technical spirit of the present disclosure, and thus, the present disclosure is not construed as being limited to the drawing.

DETAILED DESCRIPTION

Figure 1:
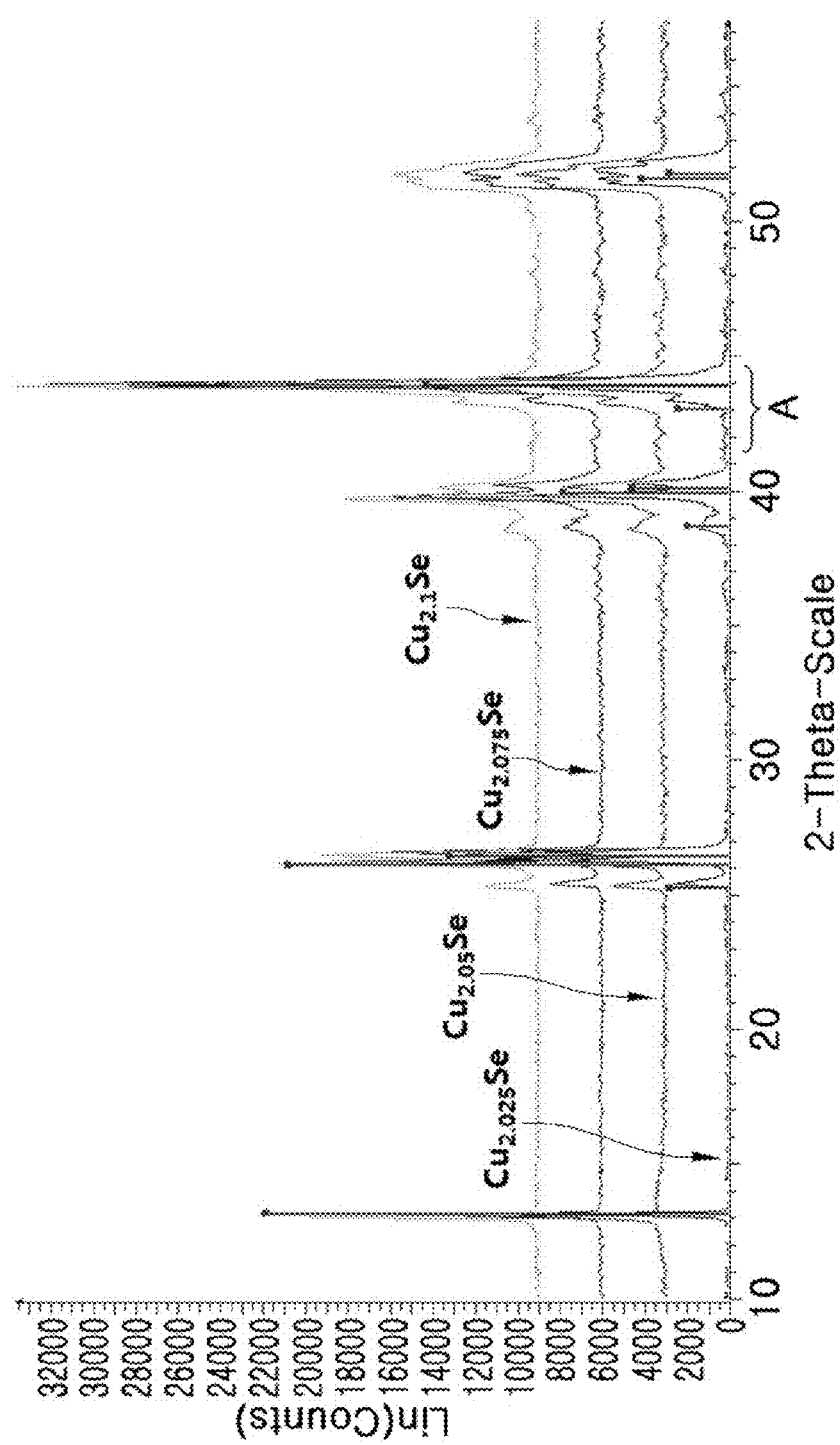
FIG. 1 is a graph of an X-ray diffraction (XRD) analysis result of a thermoelectric material according to exemplary embodiments of the present disclosure.

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the spirit and scope of the disclosure.

A thermoelectric material according to the present disclosure includes a Cu—Se matrix including Cu and Se, and Cu-containing particles. Here, the Cu-containing particles represent particles containing at least Cu, and may include particles containing only Cu and particles containing at least one element other than Cu.

Preferably, the Cu-containing particles may include at least one of Cu particles having a single Cu composition and $Cu_2O$ particles having Cu—O bonds.

Particularly, the thermoelectric material according to the present disclosure may include induced nano-dots (INDOT) as the Cu-containing particles. Here, the INDOT represents particles of a nanometer size (for example, a size of 1 nanometer to 500 nanometers in diameter) spontaneously generated during production of the thermoelectric material. That is, in the present disclosure, the INDOT may be particles induced by itself within the thermoelectric material during production of the thermoelectric material, rather than particles artificially introduced into the thermoelectric material from outside.

Further, in the present disclosure, the nano-dots, or INDOT may be present at a grain boundary of a semiconductor. Also, in the present disclosure, the INDOT may be generated at the grain boundary during production of the thermoelectric material, particularly, during sintering. In this instance, the INDOT included in the thermoelectric material according to the present disclosure may be defined as nano-dots spontaneously induced at the grain boundary of the semiconductor during sintering (induced nano-dots on grain boundary). In this case, the thermoelectric material according to the present disclosure may be a thermoelectric material including the Cu—Se matrix and the INDOT.

In this instance, the thermoelectric material including the Cu-containing particles, particularly, the INDOT according to the present disclosure may be represented the following chemical formula 1 in terms of composition:

$Cu_xSe$                                <Chemical Formula 1>

In the chemical formula 1, x is a positive rational number.
Particularly, in the chemical formula 1, $2<x\leq2.6$.
Preferably, in the chemical formula 1, the condition of $x\leq2.2$ may be satisfied. Particularly, in the chemical formula 1, $x<2.2$.
More preferably, in the chemical formula 1, the condition of $x\leq2.15$ may be satisfied.
Particularly, in the chemical formula 1, the condition of $x\leq2.1$ may be satisfied.
Also, preferably, in the chemical formula 1, the condition of $2.01\leq x$ may be satisfied. Particularly, in the chemical formula 1, $2.01<x$.
More preferably, in the chemical formula 1, the condition of $2.025\leq x$ may be satisfied. Under these conditions, the thermoelectric conversion performance of the thermoelectric material according to the present disclosure may be further improved.
Particularly, in the chemical formula 1, the condition of $2.04<x$ may be satisfied.
Preferably, in the chemical formula 1, the condition of $2.05\leq x$ may be satisfied.
More preferably, in the chemical formula 1, the condition of $2.075\leq x$ may be satisfied.
In this instance, a second phase may be included in the thermoelectric material represented by the chemical formula 1 in part, and its amount may change based on the heat treatment condition.

Based on the chemical formula, the thermoelectric material according to the present disclosure may include a larger amount of Cu than a traditional Cu—Se based thermoelectric material. In this instance, at least a part of the Cu does not form a matrix with Se, and may exist singularly as a single element or in combination with other element, for example, oxygen, and Cu existing singularly or in combination with other element may be included in a form of nano-dots. Its detailed description is provided with reference to experiment results.

Figure 2:
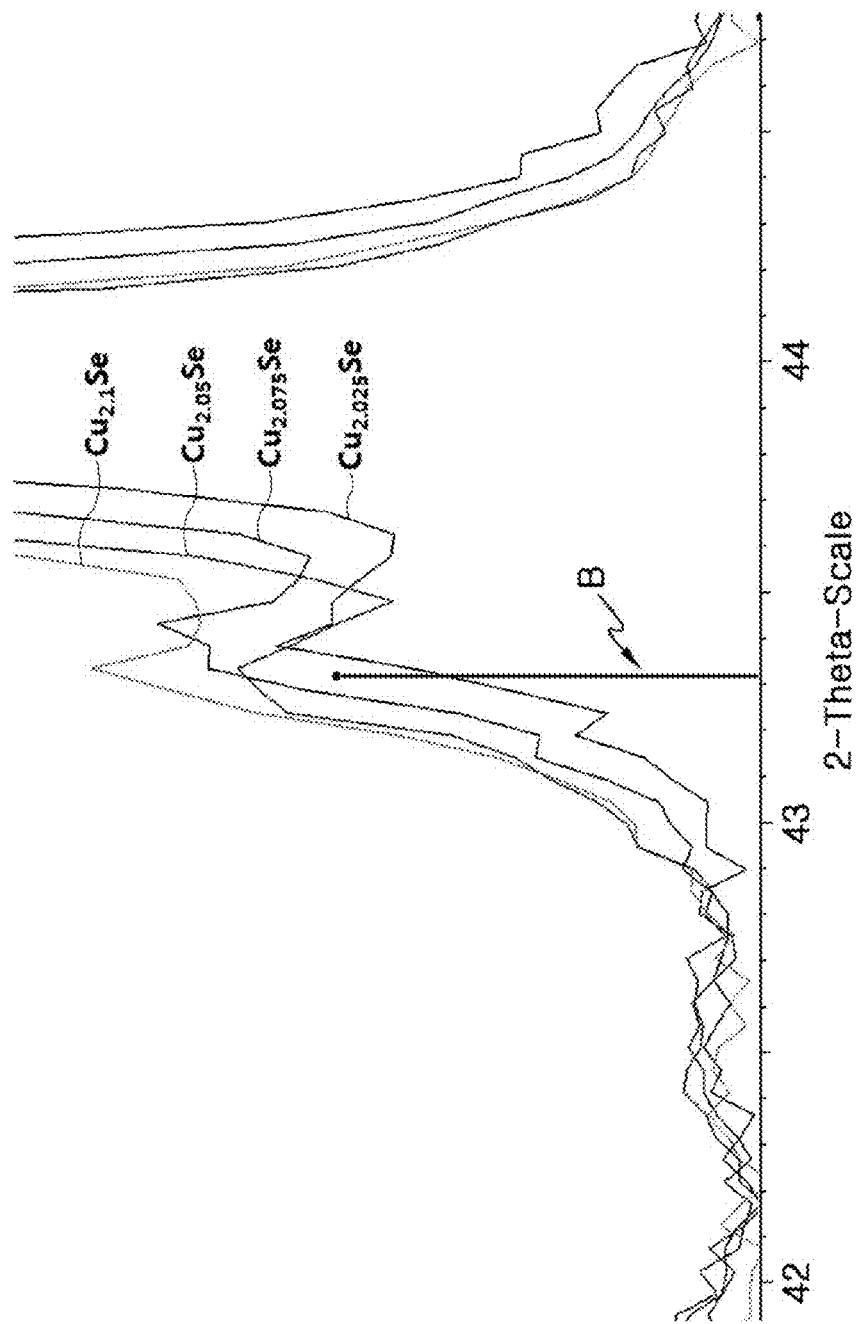
FIG. 2 is an enlarged graph of section A of FIG. 1.

FIG. 1 is a graph of an X-ray diffraction (XRD) analysis result of a thermoelectric material according to exemplary embodiments of the present disclosure, and FIG. 2 is an enlarged graph of section A of FIG. 1.

More specifically, FIGS. 1 and 2 show a graph (x-axis units: degree) of XRD pattern analysis of a $Cu_xSe$ (x=2.025, 2.05, 2.075, 2.1) thermoelectric material (manufactured by the same method as the following examples 2~5) as an example of the present disclosure. Particularly, for ease of distinguishment, in FIG. 1, the XRD pattern analysis graphs for each example are spaced a predetermined distance away from each other in the vertical direction. Also, for convenience of comparison, in FIG. 2, the graphs of each example are not spaced away from each other and overlap with each other. Further, in FIG. 2, a Cu peak occurring at a single Cu composition is indicated by B.

Referring to FIGS. 1 and 2, it can be seen that as a relative content of copper in $Cu_xSe$, or x, gradually increases from 2.025 to 2.05, 2.075, and 2.1, a height of a Cu peak gradually increases. Thus, according to the XRD analysis result, it can be found that as x gradually increases, more than 2, Cu in excess does not form a matrix such as $Cu_xSe$ with Se and exists singularly.

In this instance, Cu existing without forming a matrix with Se may be in a form of nano-dots. Also, the Cu-containing nano-dots may exist in the way of aggregating with each other within the thermoelectric material, particularly, at the grain boundary of the Cu—Se matrix. That is, in the thermoelectric material according to the present disclosure, the Cu—Se matrix is composed of a plurality of grains, and the Cu-containing INDOT may be disposed at an interface between the grains in the matrix.

FIGS. 3 through 7 are diagrams illustrating a scanning electron microscope/energy dispersive spectroscopy (SEM/EDS) analysis result of a thermoelectric material according to an exemplary embodiment of the present disclosure.

Figure 3:
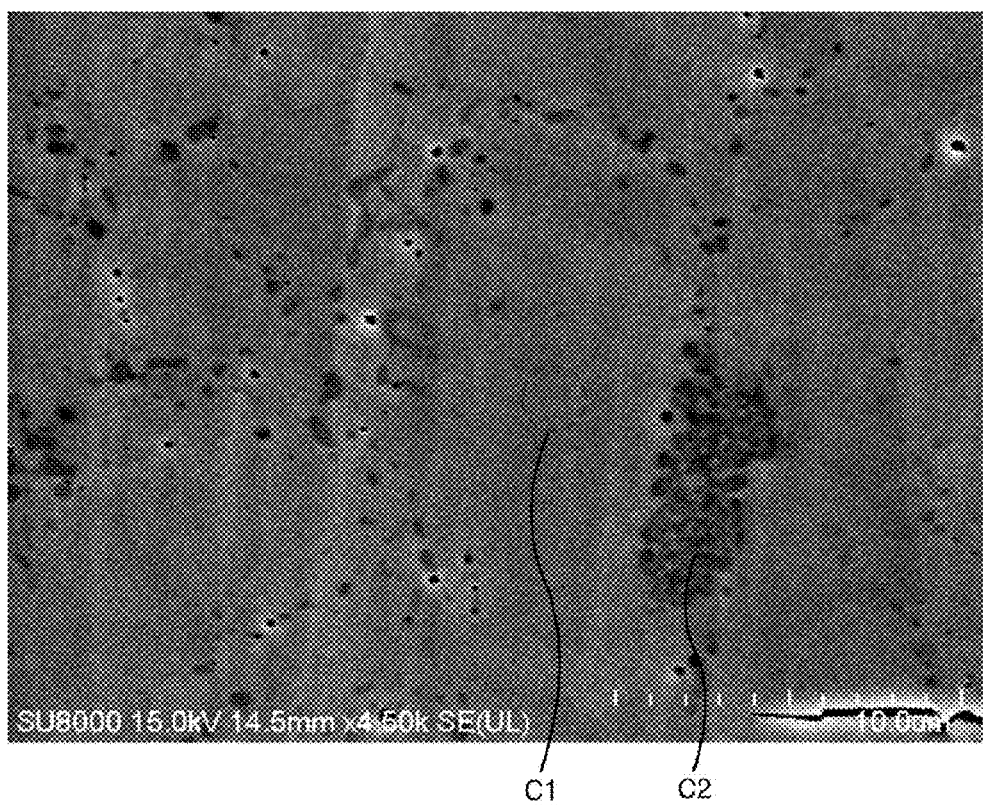
FIGS. 3 through 7 are diagrams illustrating a scanning electron microscope/energy dispersive spectroscopy (SEM/EDS) analysis result of a thermoelectric material according to an exemplary embodiment of the present disclosure.
Figure 4:
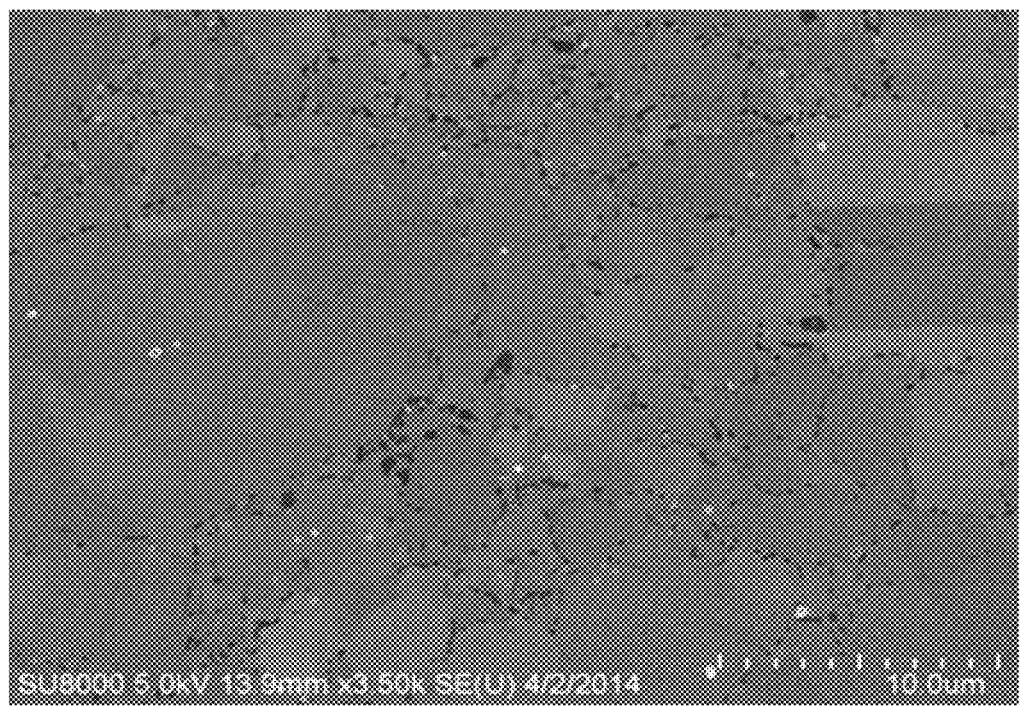
Figure 5:
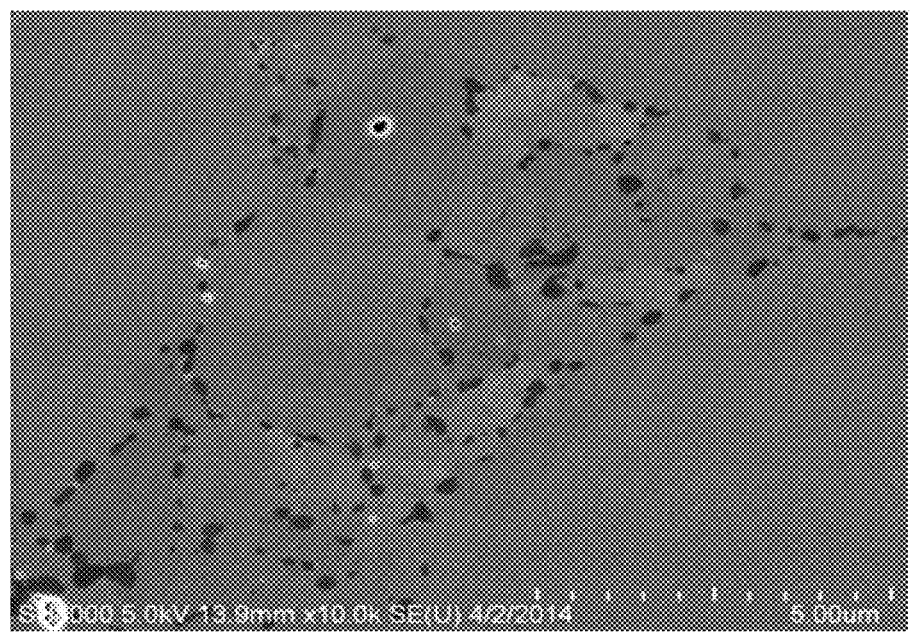

More specifically, FIG. 3 is an SEM image of a part of $Cu_{2.075}Se$ as an example of the present disclosure, and FIGS. 4 and 5 are SEM images of different parts of $Cu_{2.1}Se$ as another example of the present disclosure. Also, FIG. 6 is a graph illustrating an EDS analysis result of section C1 of FIG. 3, and FIG. 7 is a graph illustrating an EDS analysis result of section C2 of FIG. 3.

First, referring to the images of FIGS. 3 through 5, it can be seen that there are a plurality of grains having a size from about several micrometers to tens of micrometers (for example, from 1 um to 100 um) and a plurality of nano-dots having a nanometer size smaller than the grains. In this instance, it can be seen that the nano-dots may be formed along a grain boundary in a matrix including the plurality of grains as shown in the drawings, and at least some of the nano-dots may exist in the way of aggregating with each other as indicated by C2. Particularly, referring to the SEM images of FIGS. 4 and 5, it can be apparently seen that nano-dots having an average grain diameter from 1 nm to 500 nm are distributed in large amounts along the grain boundary in the Cu—Se matrix.

Figure 6:
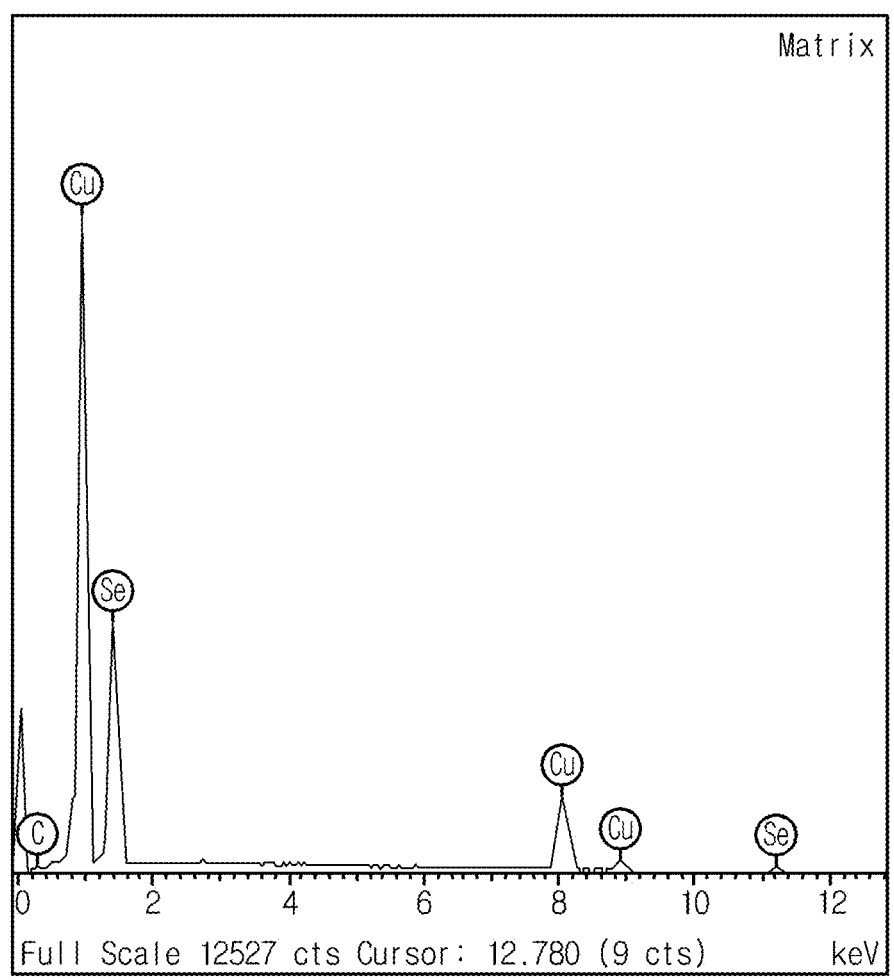

Next, referring to FIG. 6 illustrating an analysis result of section C1 of FIG. 3 where no nano-dot is observed, that is, internal analysis of the grain, it can be seen that a Cu peak and a Se peak are mainly formed. From this, it can be found that Cu and Se form a matrix in section C1 of FIG. 3. That is, the grains shown in FIG. 3 may be a Cu—Se grain having Cu and Se as a main component. Also, through a quantitative analysis, the Cu—Se matrix may exist as $Cu_xSe$ in which x has 2 or a value close to 2.

Figure 7:
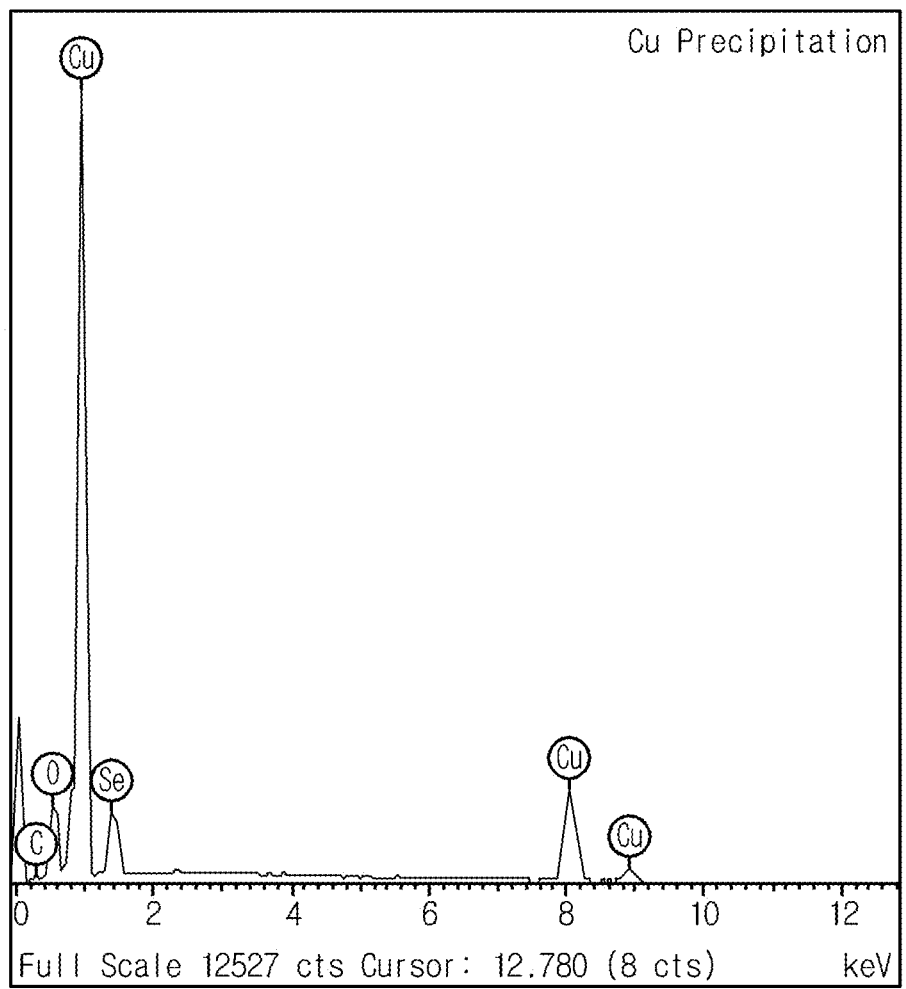

In contrast, referring to FIG. 7 illustrating an analysis result of section C2 of FIG. 3 where aggregation of nano-dots is observed, it can be seen that a Cu peak is formed dominantly high. It can be found that the nano-dots exist as Cu rather than a Cu—Se matrix. The reason that a Se peak is observed a little bit is because Se found in the Cu—Se matrix located around or under the nano-dots is measured due to the limit of the resolving power of analysis equipment or the limit of an analysis method.

Accordingly, based on these results, it can be found that the particles concentrated on section C2 of FIG. 3 are Cu-containing nano-dots. Thus, the thermoelectric material according to one aspect of the present disclosure may be a thermoelectric material including Cu particles, particularly, Cu-containing INDOT, together with the Cu—Se matrix including Cu and Se. Particularly, at least a part of the Cu-containing INDOT may exist in the way of aggregating with each other in the thermoelectric material. Here, the Cu-containing INDOT may include Cu singularly, but as shown in FIG. 7 illustrating that an O peak is observed a little bit, the Cu-containing INDOT may exist in a form of Cu oxide having bonds with O such as, for example, $Cu_2O$.

As described in the foregoing, the thermoelectric material according to one aspect of the present disclosure may include Cu-containing nano-dots, particularly, INDOT and a Cu—Se matrix. Here, the Cu—Se matrix may be represented by a chemical formula $Cu_xSe$ in which x is a positive rational number. Particularly, x may have a value near 2, for example, 1.8~2.2. Further, x may have a value less than or equal to 2, for example, 1.8~2.0. For example, the thermoelectric material according to the present disclosure may include a $Cu_2Se$ matrix and Cu-containing nano-dots.

Here, the Cu-containing nano-dots may be present at the grain boundary in the Cu—Se matrix as previously described. For example, the thermoelectric material according to the present disclosure may include a $Cu_2Se$ matrix and copper particles of a single composition at the grain boundary in the $Cu_2Se$ matrix. It is obvious that some of the Cu-containing nano-dots may be present within the grains in the Cu—Se matrix.

Accordingly, the thermoelectric material according to the present disclosure corresponds to a Cu—Se based thermoelectric material including Cu and Se, and has a lower thermal conductivity and a higher ZT value than a traditional Cu—Se based thermoelectric material.

Particularly, the thermoelectric material according to the present disclosure includes a Cu—Se matrix and Cu-containing particles. The Cu-containing particles may be prone to phonon scattering and reduce the thermal diffusivity.

The thermoelectric material according to the present disclosure may have a thermal diffusivity less than or equal to 0.5 $mm^2/s$ in the temperature range of 100° C. to 600° C.

Also, the thermoelectric material according to the present disclosure may have a ZT value higher than or equal to 0.3 over the entire temperature range 100° C. to 600° C.

Particularly, the thermoelectric material according to the present disclosure may have a ZT value higher than or equal to 0.3 in the temperature condition of 100° C. Preferably, the thermoelectric material according to the present disclosure may have a ZT value higher than or equal to 0.4 in the temperature condition of 100° C.

Also, the thermoelectric material according to the present disclosure may have a ZT value higher than or equal to 0.4 in the temperature condition of 200° C. Preferably, the thermoelectric material according to the present disclosure may have a ZT value higher than or equal to 0.5 in the temperature condition of 200° C. More preferably, the thermoelectric material according to the present disclosure may have a ZT value higher than 0.6 in the temperature condition of 200° C.

Also, the thermoelectric material according to the present disclosure may have a ZT value higher than or equal to 0.6 in the temperature condition of 300° C. Preferably, the thermoelectric material according to the present disclosure may have a ZT value higher than or equal to 0.75 in the temperature condition of 300° C. More preferably, the thermoelectric material according to the present disclosure may have a ZT value higher than 0.8 in the temperature condition of 300° C. More preferably, the thermoelectric material according to the present disclosure may have a ZT value higher than 0.9 in the temperature condition of 300° C.

Also, the thermoelectric material according to the present disclosure may have a ZT value higher than or equal to 0.7 in the temperature condition of 400° C. Preferably, the thermoelectric material according to the present disclosure may have a ZT value higher than or equal to 0.8 in the temperature condition of 400° C. More preferably, the thermoelectric material according to the present disclosure may have a ZT value higher than or equal to 1.0 in the temperature condition of 400° C.

Also, the thermoelectric material according to the present disclosure may have a ZT value higher than or equal to 0.6 in the temperature condition of 500° C. Preferably, the thermoelectric material according to the present disclosure may have a ZT value higher than or equal to 0.7 in the temperature condition of 500° C. More preferably, the thermoelectric material according to the present disclosure may have a ZT value higher than or equal to 1.1 in the temperature condition of 500° C. More preferably, the thermoelectric material according to the present disclosure may have a ZT value higher than or equal to 1.3 in the temperature condition of 500° C.

Also, the thermoelectric material according to the present disclosure may have a ZT value higher than or equal to 0.6 in the temperature condition of 600° C. Preferably, the thermoelectric material according to the present disclosure may have a ZT value higher than or equal to 0.8 in the temperature condition of 600° C. More preferably, the thermoelectric material according to the present disclosure may have a ZT value higher than or equal to 1.4 in the temperature condition of 600° C. More preferably, the thermoelectric material according to the present disclosure may have a ZT value higher than or equal to 1.8 in the temperature condition of 600° C.

The thermoelectric material according to the present disclosure may be manufactured by the following method for manufacturing a thermoelectric material.

Figure 8:
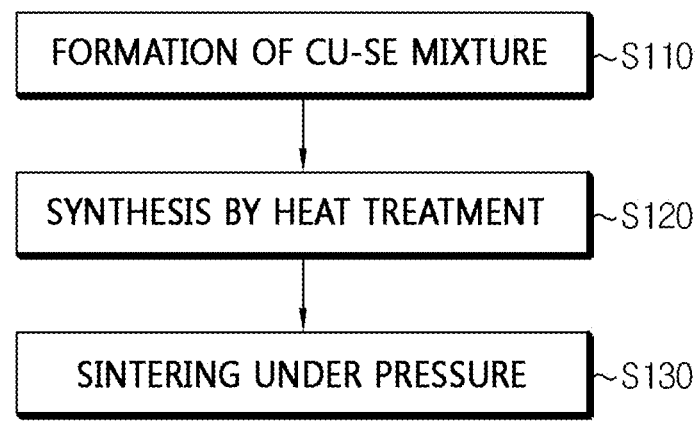
FIG. 8 is a flow chart schematically illustrating a method for manufacturing a thermoelectric material according to an exemplary embodiment of the present disclosure.

FIG. 8 is a flow chart schematically illustrating a method for manufacturing a thermoelectric material according to an exemplary embodiment of the present disclosure.

As shown in FIG. 8, the method for manufacturing a thermoelectric material including Cu-containing particles together with a Cu—Se matrix according to the present disclosure includes a mixture forming step (S110) and a compound forming step (S120).

The mixture forming step S110 is a step for mixing Cu and Se as a raw material to form a mixture. Particularly, in S110, the mixture may be formed by weighing Cu and Se based on the chemical formula weight of the above chemical formula 1, i.e., $Cu_xSe$ (x is a positive rational number) and mixing them.

Particularly, in S110, Cu and Se may be mixed in the range of 2<x≤2.6 of the above chemical formula 1.

Preferably, in S110, Cu and Se in powder form may be mixed. In this case, Cu and Se may be mixed better, resulting in more favorable synthesis of $Cu_xSe$.

In this instance, mixing of Cu and Se in the mixture forming step S110 may be performed by hand milling using a mortar, ball milling, planetary ball mill, and the like, but the present disclosure is not limited to these specific mixing methods.

The compound forming step S120 is a step for thermally treating the mixture formed in S110 to form a $Cu_xSe$ compound (x is a positive rational number, particularly, 2<x≤2.6). For example, in S120, the $Cu_xSe$ compound may be formed by putting the mixture of Cu and Se into a furnace and heating for a predetermined time at a predetermined temperature.

Preferably, S120 may be performed by a solid state reaction (SSR) method. When the synthesis is performed by the solid state reaction method, the raw material used in the synthesis, that is, the mixture may cause reaction in a solid state without changing to a liquid state during the synthesis.

For example, S120 may be performed in the temperature range of 200° C. to 650° C. for 1 to 24 hours. Because the temperature is in a temperature range lower than a melting point of Cu, when the heating is performed in the temperature range, the $Cu_xSe$ compound may be formed in which Cu does not melt. Particularly, S120 may be performed under the temperature condition of 500° C. for 15 hours.

In S120, to form the $Cu_xSe$ compound, the mixture of Cu and Se may be put into a hard mold and formed into pellets, and the mixture in pellet form may be put into a fused silica tube and vacuum-sealed. Also, the vacuum-sealed first mixture may be put into the furnace and thermally treated.

Preferably, the method for manufacturing a thermoelectric material according to the present disclosure may further include sintering the compound under pressure (S130) after the compound forming step S120.

Here, S130 is preferably performed by a hot press (HP) or spark plasma sintering (SPS) technique. The thermoelectric material according to the present disclosure may be easy to obtain a high sintering density and a thermoelectric performance improvement effect, when sintered by the pressure sintering technique.

For example, the pressure sintering step may be performed under the pressure condition of 30 MPa to 200 MPa. Also, the pressure sintering step may be performed under the temperature condition of 300° C. to 800° C. Also, the pressure sintering step may be performed under the pressure and temperature conditions for 1 minute to 12 hours.

Also, S130 may be performed in a vacuum state, or while flowing gas such as Ar, He, $N_2$, and the like, containing some or no hydrogen.

Also, preferably, S130 may be performed by grinding the compound formed in S120 into powder, and then performing pressure sintering. In this case, convenience in the sintering and measuring step may be improved and the sintering density may further increase.

Particularly, in the thermoelectric material according to the present disclosure, the Cu-containing particles may be spontaneously formed in the pressure sintering step S130. That is, the Cu-containing particles of the thermoelectric material according to the present disclosure are not forcibly introduced from outside, and may be spontaneously induced during the manufacturing process, particularly, during sintering step. Accordingly, the Cu-containing particles according to the present disclosure may be INDOT (Induced Nano DOT). According to this aspect of the present disclosure, the Cu-containing particles may be easily formed without the need for intensive efforts to introduce the Cu-containing particles into the thermoelectric material, particularly, at the grain boundary.

A thermoelectric conversion element according to the present disclosure may include the above thermoelectric material. Particularly, the thermoelectric material according to the present disclosure may effectively improve a ZT value in a broad temperature range, compared to a traditional thermoelectric material, particularly, a Cu—Se based thermoelectric material. Thus, the thermoelectric material according to the present disclosure may replace a traditional thermoelectric conversion material or may be effectively used in a thermoelectric conversion element in conjunction with a traditional compound semiconductor.

Further, the thermoelectric material according to the present disclosure may be used in a thermoelectric power generator designed for thermoelectric power generation using a waste heat source, etc. That is, the thermoelectric power generator according to the present disclosure includes the above thermoelectric material according to the present disclosure. The thermoelectric material according to the present disclosure exhibits a high ZT value in a broad temperature range such as a temperature range of 100° C. to 600° C., and thus, may be applied to thermoelectric power generation more usefully.

Also, the thermoelectric material according to the present disclosure may be manufactured as a bulk-type thermoelectric material.

Hereinafter, the present disclosure will be described in detail through examples and comparative examples. The examples of the present disclosure, however, may take several other forms, and the scope of the present disclosure should not be construed as being limited to the following examples. The examples of the present disclosure are provided to more fully explain the present disclosure to those having ordinary knowledge in the art to which the present disclosure pertains.

Example 1

Cu and Se in powder form were weighed based on a chemical formula $Cu_{2.01}Se$, and put in an alumina mortar, followed by mixing. The mixed materials were put into a hard mold, formed into pellets, put in a fused silica tube, and vacuum-sealed. Also, the result was put in a box furnace, and heated at 500° C. for 15 hours, and after heating, was slowly cooled down to room temperature to obtain a compound.

Also, the $Cu_{2.01}Se$ compound was filled in a hard mold for hot pressing, and was hot press sintered in the condition of 650° C. under vacuum to obtain a sample of example 1. In this instance, a sintering density was at least 98% of a theoretical value.

Example 2

Cu and Se in powder form were weighed based on a chemical formula $Cu_{2.025}Se$, and mixed and synthesized by the same process as example 1 to obtain a compound. Also, the compound was sintered by the same process as example 1 to obtain a sample of example 2.

Example 3

Cu and Se in powder form were weighed based on a chemical formula $Cu_{2.05}Se$, and mixed and synthesized by the same process as example 1 to obtain a compound. Also, the compound was sintered by the same process as example 1 to obtain a sample of example 3.

Example 4

Cu and Se in powder form were weighed based on a chemical formula $Cu_{2.075}Se$, and mixed and synthesized by the same process as example 1 to obtain a compound. Also, the compound was sintered by the same process as example 1 to obtain a sample of example 4.

Example 5

Cu and Se in powder form were weighed based on a chemical formula $Cu_{2.1}Se$, and mixed and synthesized by the same process as example 1 to obtain a compound. Also, the compound was sintered by the same process as example 1 to obtain a sample of example 5.

Example 6

Cu and Se in powder form were weighed based on a chemical formula $Cu_{2.15}Se$, and mixed and synthesized by the same process as example 1 to obtain a compound. Also, the compound was sintered by the same process as example 1 to obtain a sample of example 6.

Example 7

Cu and Se in powder form were weighed based on a chemical formula $Cu_{2.2}Se$, and mixed and synthesized by the same process as example 1 to obtain a compound. Also, the compound was sintered by the same process as example 1 to obtain a sample of example 7.

Comparative Example 1

Cu and Se in powder form were weighed based on a chemical formula $Cu_{1.8}Se$, and mixed and synthesized by the same process as example 1 to obtain a compound. Also, the compound was sintered by the same process as example 1 to obtain a sample of comparative example 1.

Comparative Example 2

Cu and Se in powder form were weighed based on a chemical formula $Cu_{1.9}Se$, and mixed and synthesized by the same process as example 1 to obtain a compound. Also, the compound was sintered by the same process as example 1 to obtain a sample of comparative example 2.

Comparative Example 3

Cu and Se in powder form were weighed based on a chemical formula $Cu_{2.0}Se$, and mixed and synthesized by the same process as example 1 to obtain a compound. Also, the compound was sintered by the same process as example 1 to obtain a sample of comparative example 3.

It was found, as shown in FIGS. 1 through 7, that the samples of examples 1~7 obtained in this way included Cu-containing nano-dots, particularly INDOT, together with a Cu—Se matrix. In contrast, for the samples of comparative examples 1~3, it was found that a Cu-containing nano-dot was not included. Typically, a scanning ion microscope (SIM) image of the sample manufactured in example 4 is shown in FIG. 9, and an SIM image of the sample manufactured in comparative example 3 is shown in FIG. 10.

Figure 9:
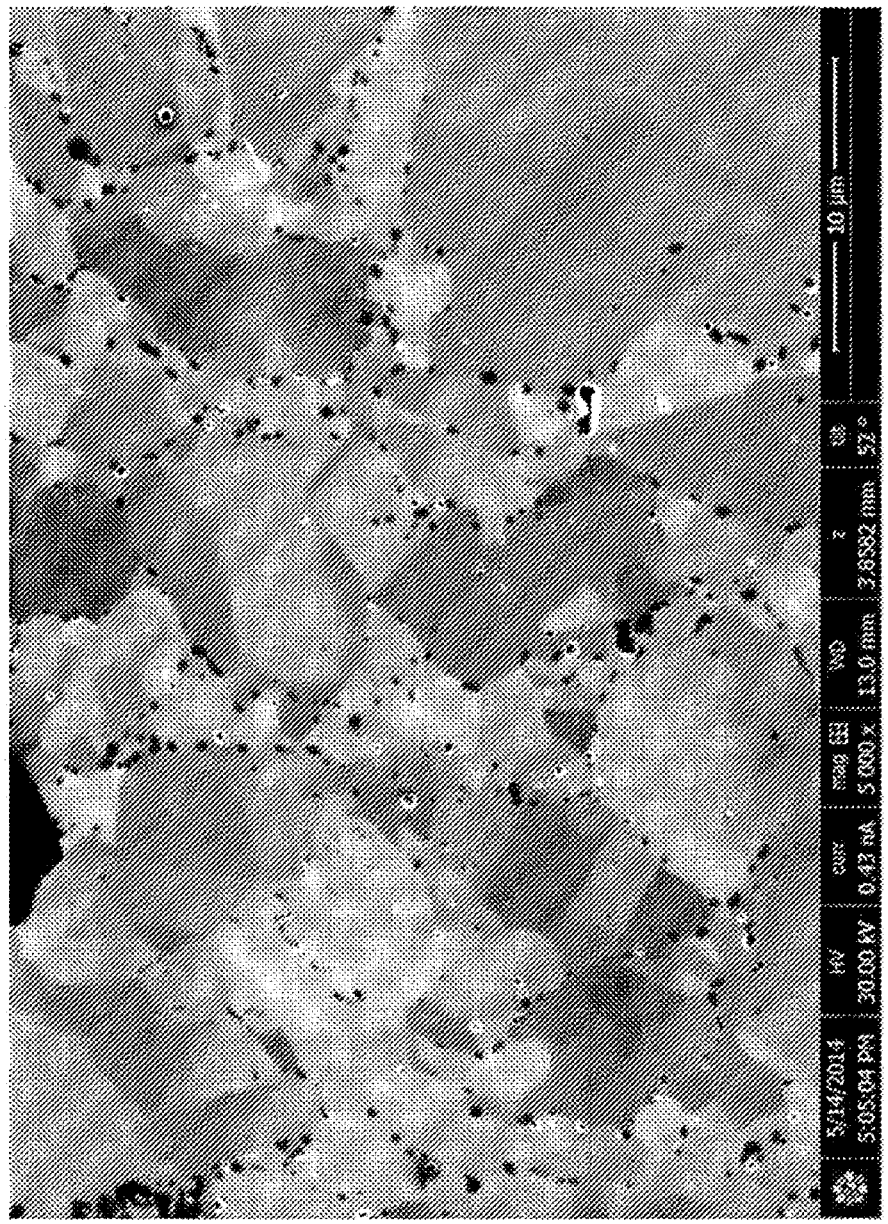
FIG. 9 is a scanning ion microscope (SIM) image of a thermoelectric material according to an example of the present disclosure.

First, referring to FIG. 9, in the case of the thermoelectric material according to example 4 of the present disclosure, nano-dots are found. Also, the nano-dots are Cu-containing nano-dots as previously noted. Particularly, as shown in FIG. 9, the nano-dots may be primarily distributed along a grain boundary.

Figure 10:
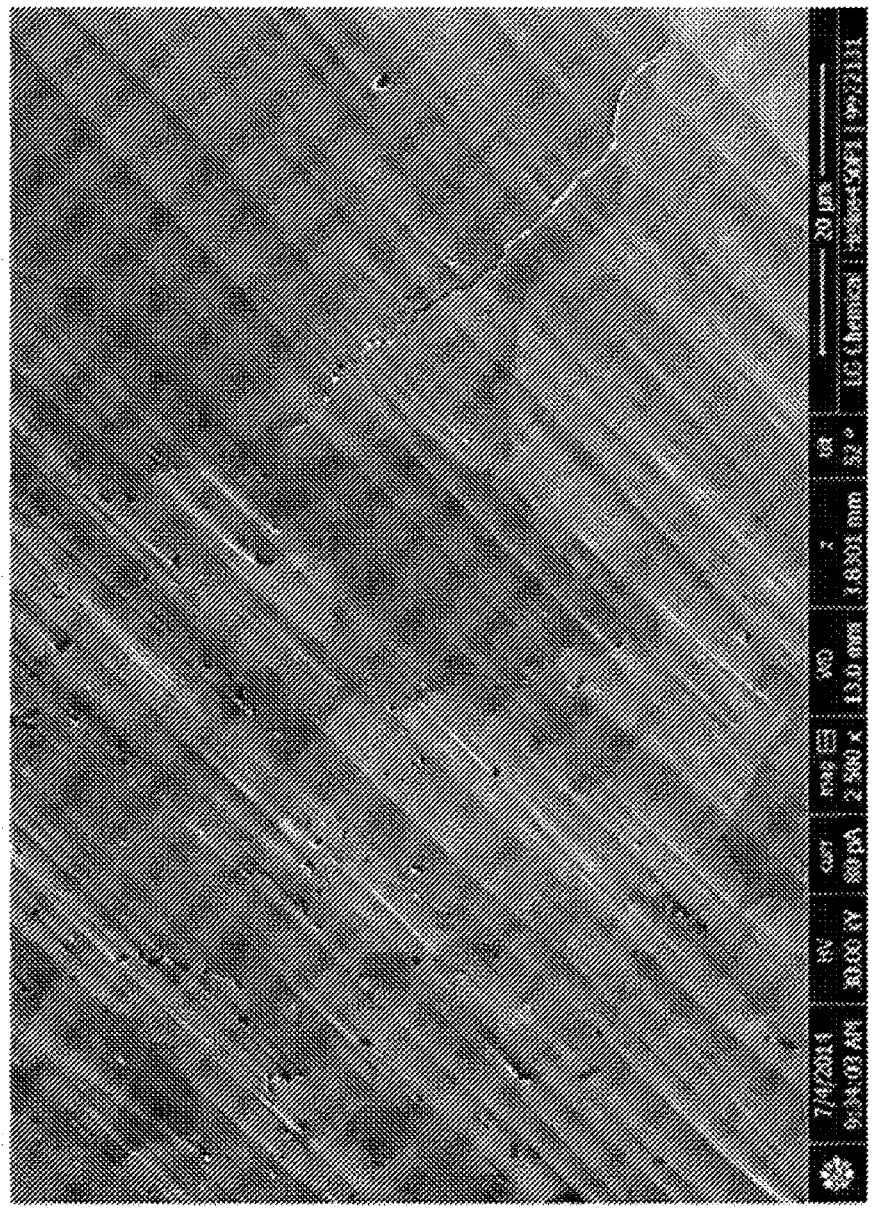
FIG. 10 is an SIM image of a thermoelectric material according to a comparative example.

In contrast, referring to FIG. 10, it can be seen that a nano-dot is absent in the thermoelectric material according to comparative example 4. It can be said that a black spot seen in FIG. 10 is just a pore, but is not a nano-dot.

Figure 11:
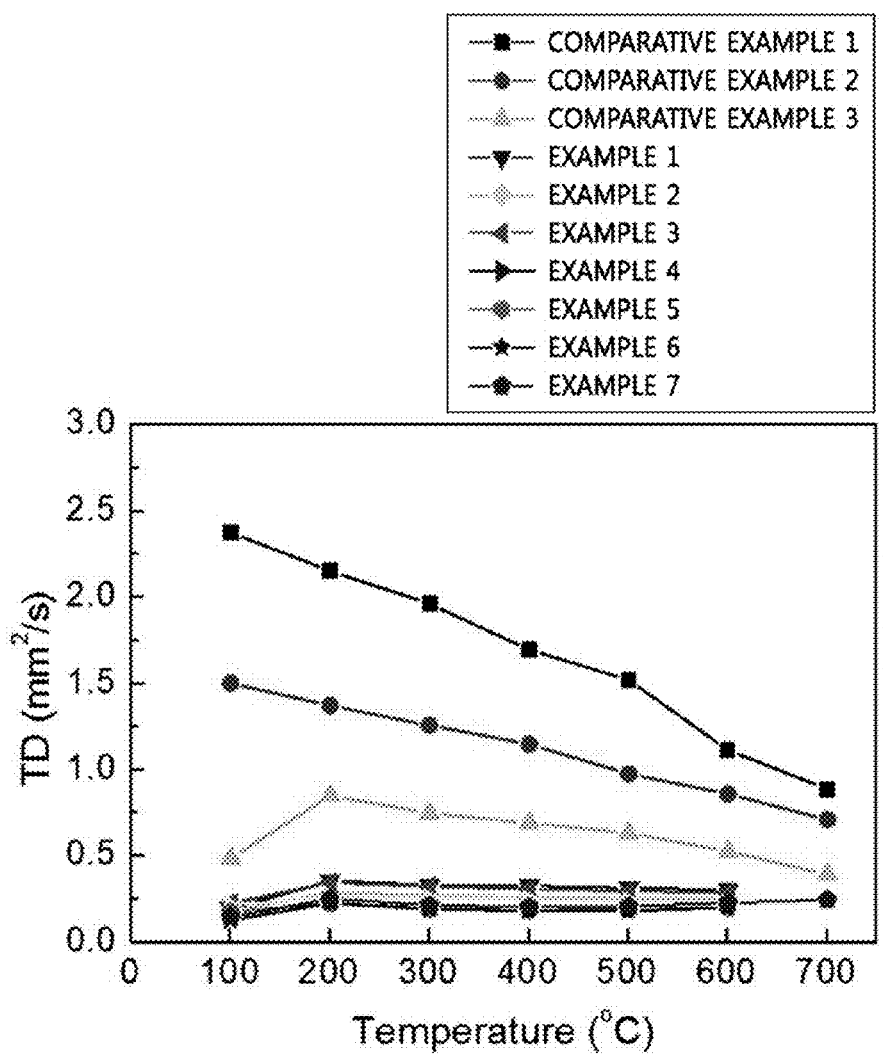
FIG. 11 is a graph illustrating a comparison of thermal diffusivity measurement results based on temperature for thermoelectric materials according to examples of the present disclosure and comparative examples.

For the samples of examples 1~7 and the samples of comparative examples 1~3, thermal diffusivity (TD) was measured at a predetermined temperature interval using LFA457 (Netzsch), and its result is illustrated in FIG. 11 with examples 1~7 and comparative examples 1~3.

Figure 12:
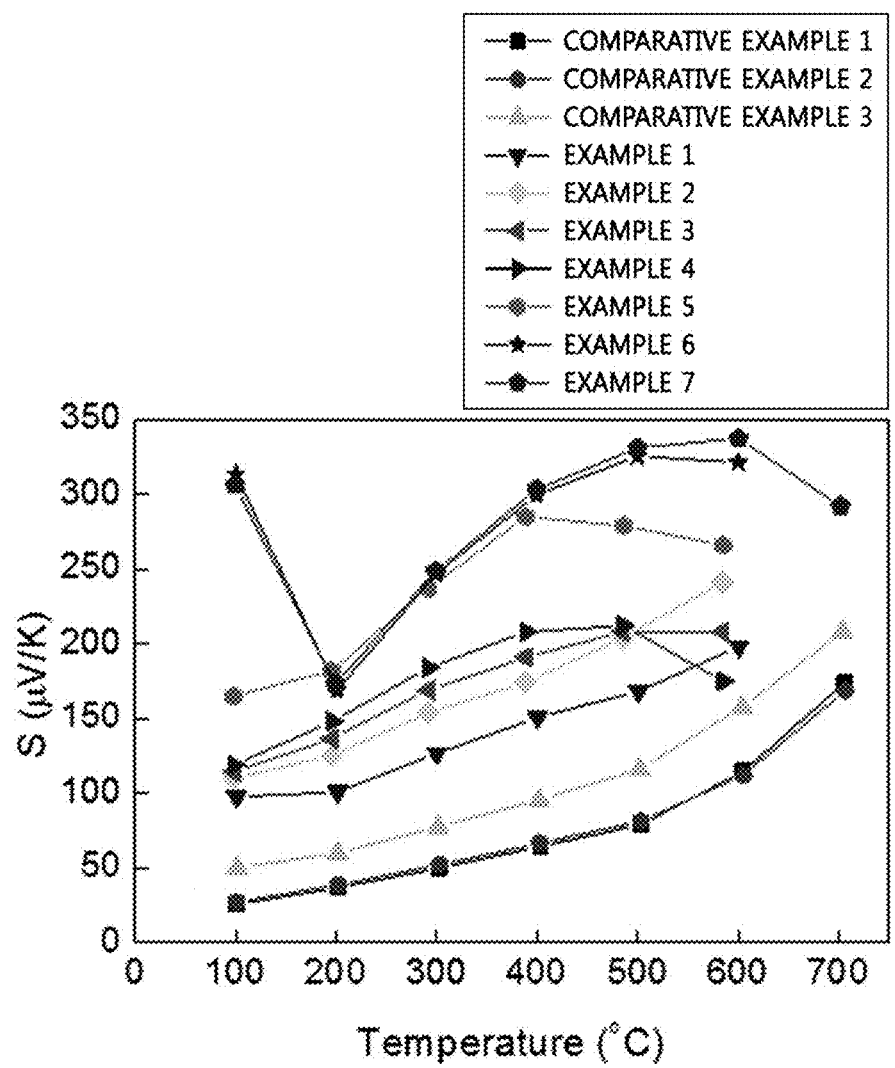
FIG. 12 is a graph illustrating a comparison of Seebeck coefficient measurement results based on temperature for thermoelectric materials according to examples of the present disclosure and comparative examples.
Figure 13:
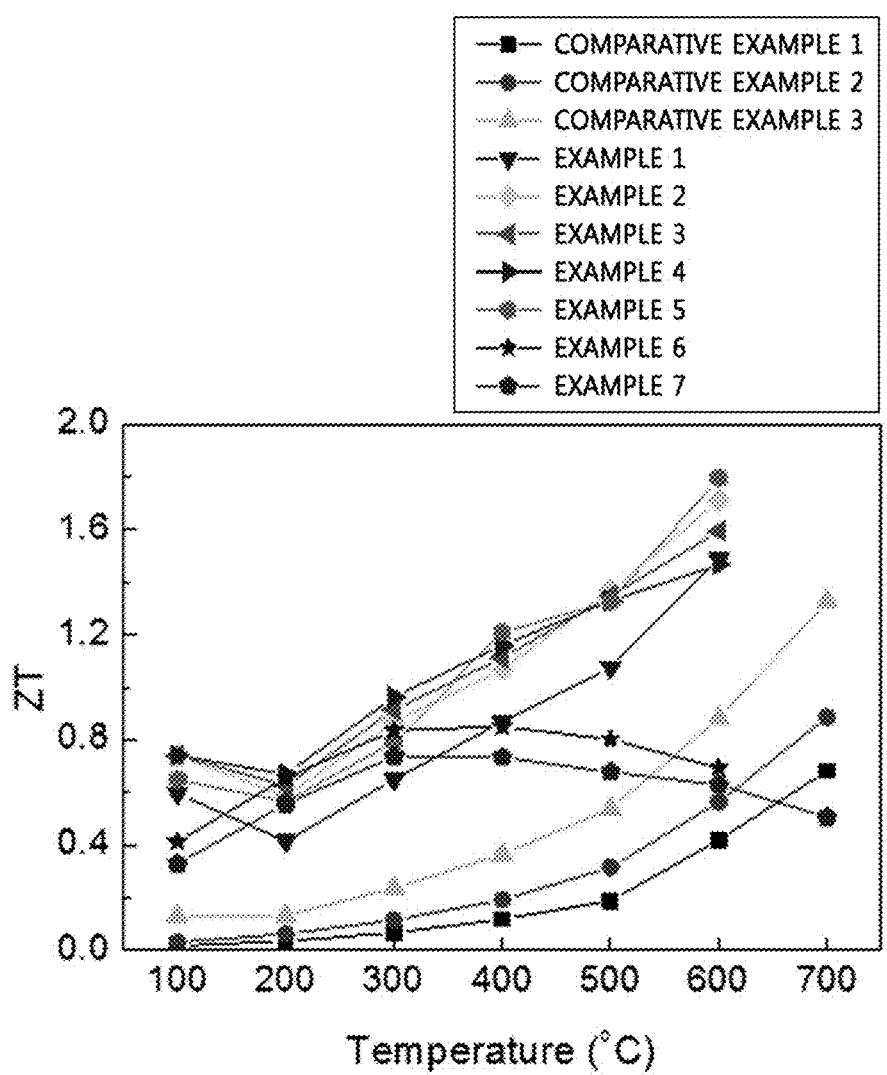
FIG. 13 is a graph illustrating a comparison of ZT value measurement results based on temperature for thermoelectric materials according to examples of the present disclosure and comparative examples.

Also, for different parts of each of the samples of examples 1~7 and the samples of comparative examples 1~3, an electrical conductivity and a Seebeck coefficient of the samples were measured at a predetermined temperature interval sample using ZEM-3 (Ulvac-Riko, Inc), and a Seebeck coefficient (S) measurement result is illustrated in FIG. 12 with examples 1~7 and comparative examples 1~3. Also, a ZT value was calculated using each of the measured values, and its result is illustrated in FIG. 13 with examples 1~7 and comparative examples 1~3.

First, referring to the result of FIG. 11, it can be seen that the thermoelectric materials including INDOT according to examples 1~7 have a remarkably lower thermal diffusivity than the thermoelectric materials without including INDOT according to comparative examples 1~3 over the entire temperature measurement range of 100° C. to 700° C.

Particularly, it can be seen that the samples of examples according to the present disclosure have a thermal diffusivity lower than or equal to 0.5 mm²/s, preferably, lower than 0.4 mm²/s, remarkably lower than the samples of comparative examples, over the entire temperature range of 100° C. to 600° C.

Next, referring to the result of FIG. 12, it can be seen that the thermoelectric materials of examples 1~7 according to the present disclosure have a Seebeck coefficient much higher than the thermoelectric materials of comparative examples 1~3 over the entire temperature measurement range of 100° C. to 700° C.

Also, seeing ZT values of each sample with reference to the result of FIG. 13, the thermoelectric materials of examples 1~7 according to the present disclosure have a ZT value remarkably higher than the thermoelectric materials of comparative examples 1~3.

Particularly, the thermoelectric materials according to comparative examples generally has a very low ZT value in the temperature range lower than 500° C., and moreover, has a ZT value lower than or equal to 0.2 in the low temperature range of 100° C. to 300° C.

In contrast, it can be seen that the thermoelectric materials according to examples of the present disclosure have a very high ZT value in the low temperature range and the intermediate temperature range lower than 500° C. as well as in the high temperature range higher than or equal to 500° C., when compared to comparative examples.

In summary, the thermoelectric materials of examples 1~6 show performance improvement in ZT value about twice higher at 600° C. than the thermoelectric materials of comparative examples 1~3.

More specifically, the thermoelectric materials of comparative examples generally exhibit very low performance of a ZT value of 0.15 to 0.1 or lower in the temperature condition of 100° C., while the thermoelectric materials of examples according to the present disclosure exhibit high performance of 0.3 to 0.4 or higher in the temperature condition of 100° C.

Also, in the temperature condition of 200° C., the thermoelectric materials of comparative examples exhibit a very low ZT value of 0.15 to 0.1 or lower similar to the case of 100° C., while the thermoelectric materials of examples according to the present disclosure exhibit a high ZT value of 0.4 or higher, to the maximum, 0.5~0.7.

Also, in the temperature condition of 300° C., the thermoelectric materials of comparative examples exhibit a ZT value near about 0.1~0.2, while the thermoelectric materials of examples according to the present disclosure all exhibit a value of 0.6 or higher, to the maximum, 0.7~0.8 or higher, with a large difference therebetween.

Also, in the temperature condition of 400° C., the thermoelectric materials of comparative examples exhibit a ZT value of 0.1~0.2, to the maximum, about 0.35, while the thermoelectric materials of examples according to the present disclosure all exhibit a value higher than or equal to 0.7, and most of them exhibit a high value of 0.8, to the maximum, 1.0~1.2.

Also, in the temperature condition of 500° C., it can be seen that the thermoelectric materials of comparative examples exhibit a value lower than or equal to about 0.5, while the thermoelectric materials of examples according to the present disclosure exhibit a very high ZT value of 0.6 or higher, to the maximum, 1.0~1.4.

Also, in the temperature condition of 600° C., the thermoelectric materials of comparative examples 1~3 generally exhibit a ZT value of 0.4~0.9, while the thermoelectric materials of examples 1~5 according to the present disclosure exhibit a very high ZT value of 1.4~1.7, with a large difference from the thermoelectric materials of comparative examples.

Taking the foregoing results into comprehensive consideration, it can be seen that the thermoelectric materials including the Cu-containing nano-dots, particularly, INDOT according to each example of the present disclosure have a remarkably low thermal diffusivity and a remarkably high ZT value over the entire temperature range of 100° C. to 600° C., compared to the conventional thermoelectric materials according to comparative examples. Accordingly, the thermoelectric material according to the present disclosure is excellent in thermoelectric conversion performance, and may be used as a thermoelectric conversion material very usefully.

Figure 14:
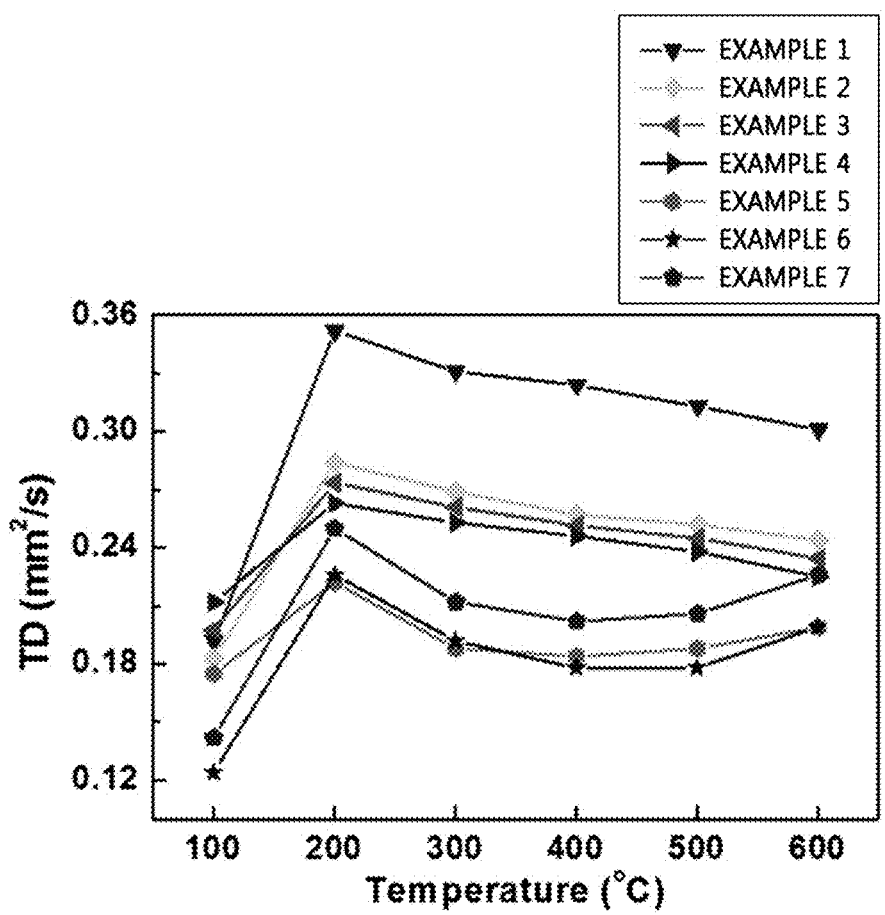
FIG. 14 is a graph with a change in y-axis scale only for the examples of FIG. 9.
Figure 15:
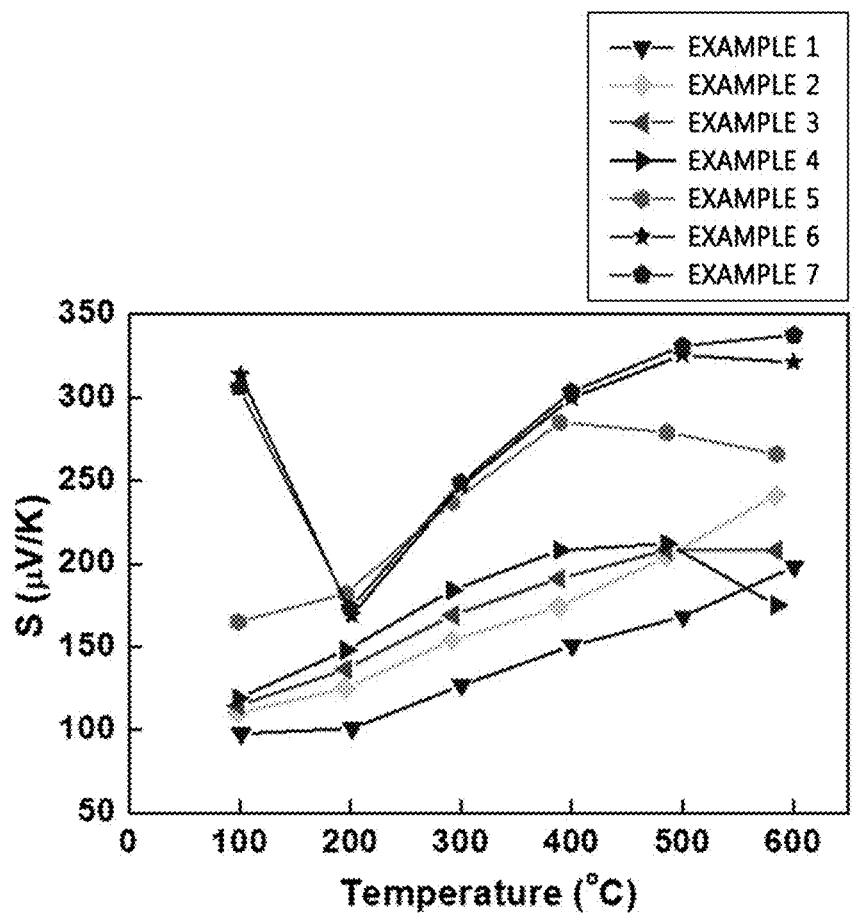
FIG. 15 is a graph with a change in y-axis scale only for the examples of FIG. 10.

Additionally, for comparison of examples, a description is provided with reference to FIGS. 14 and 15 because it is not easy to distinguish the examples in FIGS. 11 and 12.

FIGS. 14 and 15 are graphs with a change in y-axis scale only for the examples in FIGS. 11 and 12.

Referring to FIGS. 14 and 15, it can be seen that the thermoelectric material according to the present disclosure represented by the chemical formula 1 ($Cu_xSe$) has a much lower thermal diffusivity and a much higher Seebeck coefficient, when $x>2.04$, more specifically, $x \geq 2.05$.

Further, seeing the thermal diffusivity (TD) result of FIG. 14, it can be found that the thermal diffusivity of examples 3 through 7 in which x in chemical formula 1 is higher than 2.04 is generally lower than examples 1 and 2 in which x in chemical formula 1 is lower than 2.04. Particularly, examples 5 through 7, more specifically, examples 5 and 6 show remarkably low results in the temperature range of 200° C. to 600° C.

Also, seeing the Seebeck coefficient (S) result of FIG. 15, it can be found that examples 3 through 7 in which x in chemical formula 1 is higher than 2.04 is generally higher in Seebeck coefficient than examples 1 and 2 in which x in chemical formula 1 is lower than 2.04. Particularly, for examples 5 through 7, the Seebeck coefficient is found much higher than that of the other examples. Further, in the range of 100° C. to 200° C., and in the range of 400° C. to 600° C., the Seebeck coefficient of examples 6 and 7 is found much higher than that of the other examples.

As described in the foregoing, the thermoelectric material according to the present disclosure is preferably synthesized by a solid state reaction (SSR) method. Hereinafter, a description of the SSR synthesis method and its effect is provided in comparison to a melting method.

Example 8

Cu and Se in powder form were weighed based on a chemical formula $Cu_{2.025}Se$, and put in an alumina mortar, followed by mixing. The mixed materials were put into a hard mold, formed into pellets, put in a fused silica tube, and vacuum-sealed. Also, the result was put in a box furnace, and heated at 1100° C. for 12 hours, and in this instance, a temperature increase time was 9 hours. Then, the result was heated at 800° C. for 24 hours again, and in this instance, a temperature decrease time was 24 hours. After heating, the result was slowly cooled down to room temperature to obtain a compound.

Also, the compound was filled in a hard mold for hot pressing, and was hot press sintered in the condition of 650° C. under vacuum to obtain a sample of example 8. In this instance, a sintering density was at least 98% of a theoretical value.

Example 9

Cu and Se in powder form were weighed based on a chemical formula $Cu_{2.1}Se$, and mixed and synthesized by the same process as example 8 to obtain a compound. Also, the compound was sintered by the same process as example 8 to obtain a sample of example 9.

The samples according to examples 8 and 9 differ in synthesis method from the previous examples 1 through 7. That is, in the case of the samples according to examples 1 through 7, the thermoelectric material was synthesized by an SSR method by which synthesis was performed in a state that at least some of the raw materials did not melt, but in the case of the samples according to examples 8 and 9, the thermoelectric material was synthesized by a melting method by which all the raw materials were heated beyond the melting point.

Figure 16:
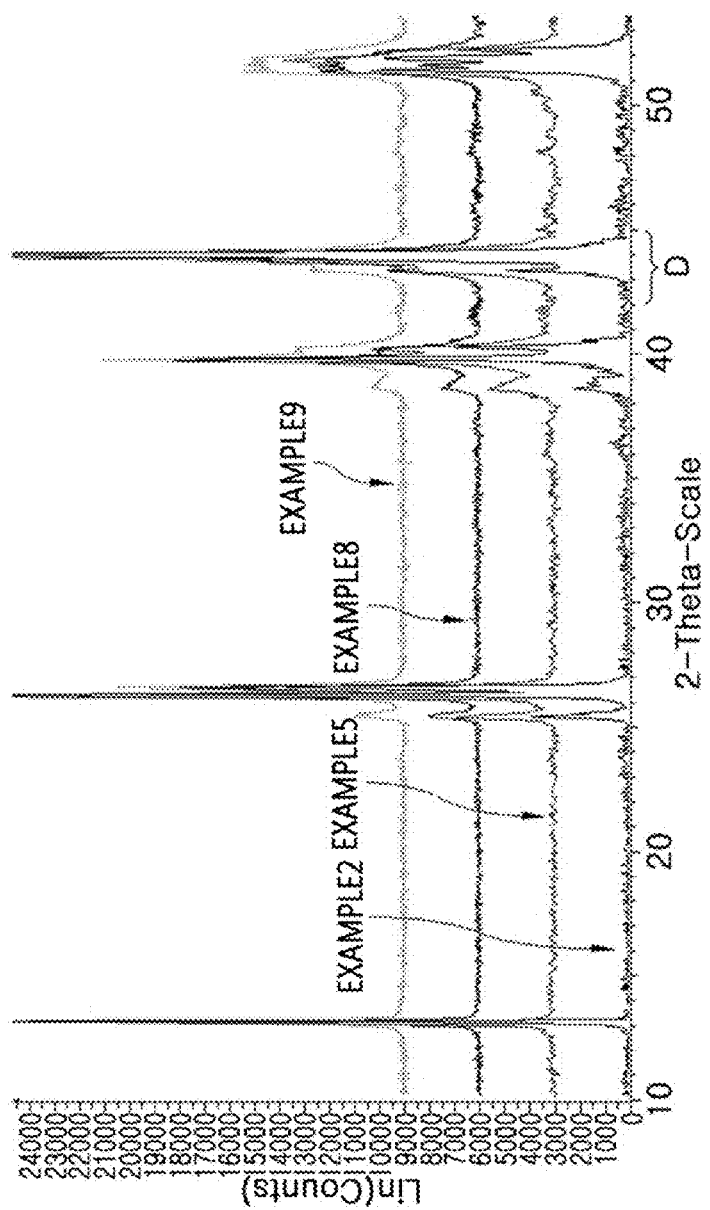
FIG. 16 is a graph illustrating a comparison of XRD analysis results of thermoelectric materials manufactured by different synthesis methods according to different exemplary embodiments of the present disclosure.

For the samples of examples 8 and 9 obtained in this way, an XRD analysis was conducted, and its result is shown in FIG. 16. Also, with an aim to compare to them, for the samples corresponding to examples 2 and 5 synthesized by an SSR method, an XRD analysis was conducted, and its result is shown in FIG. 16, and its partial enlarged graph is provided in FIG. 17. Particularly, for ease of distinguishment, in FIG. 16, XRD pattern analysis graphs for each example are spaced a predetermined distance away from each other in the vertical direction. Also, in FIG. 17, graphs of each example are not spaced away from each other and overlap with each other. Further, in FIG. 17, a Cu peak occurring when Cu exists singularly is represented by E.

Figure 17:
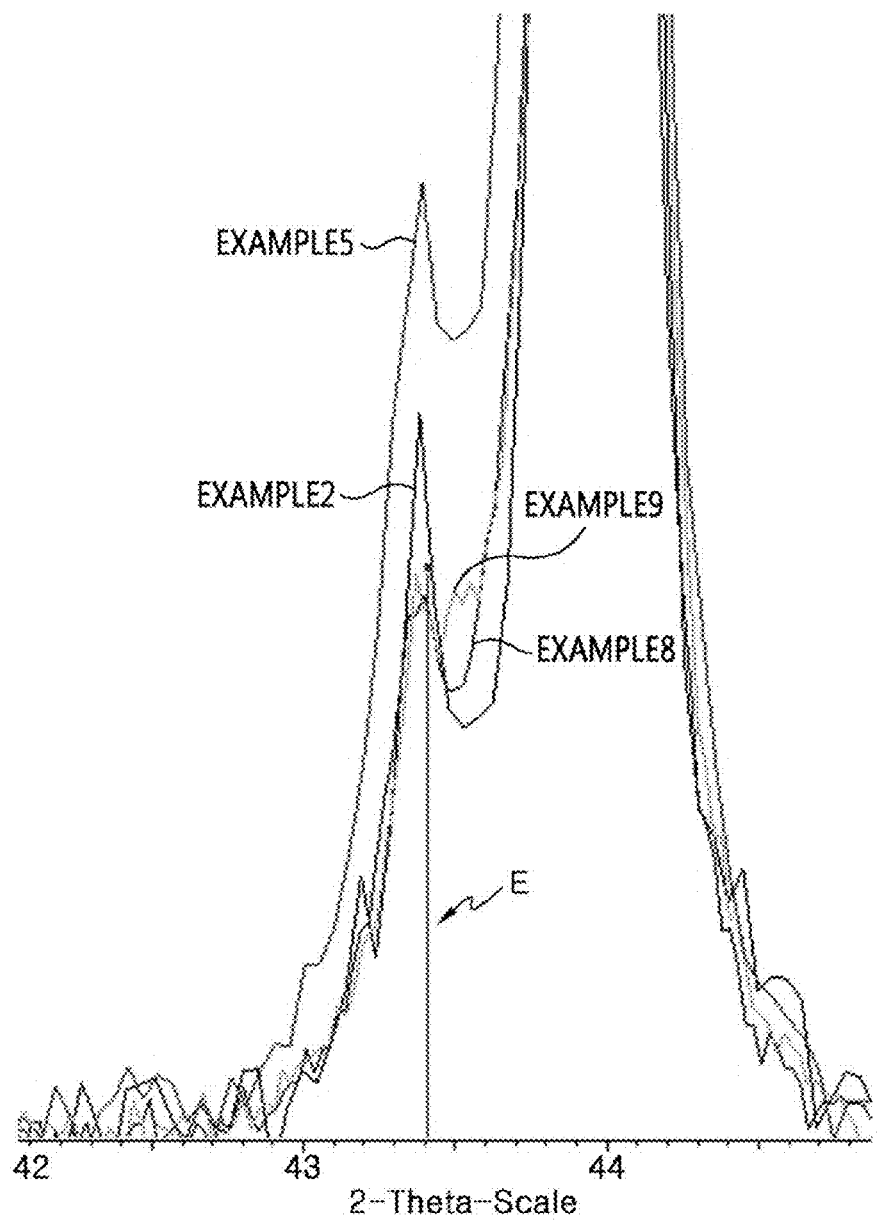
FIG. 17 is an enlarged graph of section D of FIG. 16.

Referring to FIGS. 16 and 17, it can be seen that a height of the Cu peak of example 2 and example 5 synthesized by an SSR method is formed much higher than that of example 8 and example 9 synthesized by a melting method. Thus, according to the XRD analysis result, it can be seen that a larger amount of Cu existing singularly is present when the thermoelectric material according the present disclosure is synthesized by an SSR method than a melting method. Particularly, in the case of a melting method, copper does not exist within a Cu—Se matrix or at a grain boundary in the form of nano-dots, and may be in a released and precipitated form. Thus, in the case of the thermoelectric material according to the present disclosure, synthesis by an SSR method is preferred. The advantage of the SSR method over the melting method is described in more detail with reference to FIGS. 18 through 20.

Figure 18:
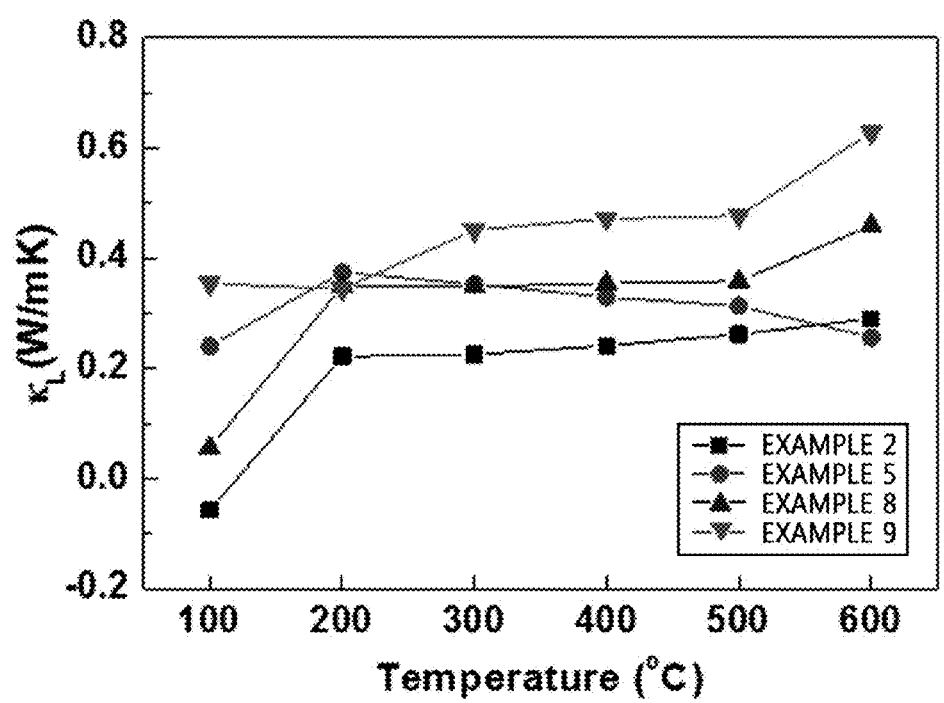
FIG. 18 is a graph illustrating a comparison of lattice thermal conductivity measurement results based on temperature for thermoelectric materials according to different exemplary embodiments of the present disclosure, manufactured by different synthesis methods.
Figure 19:
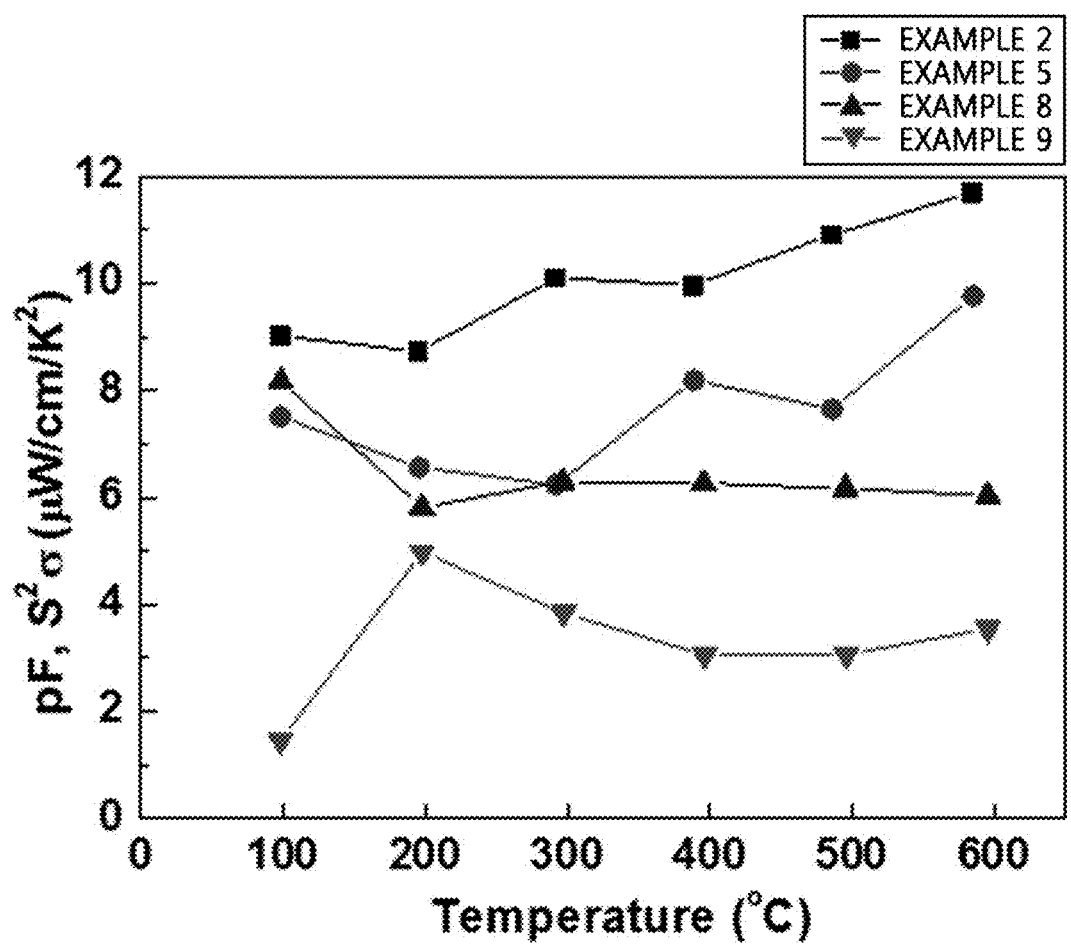
FIG. 19 is a graph illustrating a comparison of power factor measurement results based on temperature for thermoelectric materials according to different exemplary embodiments of the present disclosure, manufactured by different synthesis methods.
Figure 20:
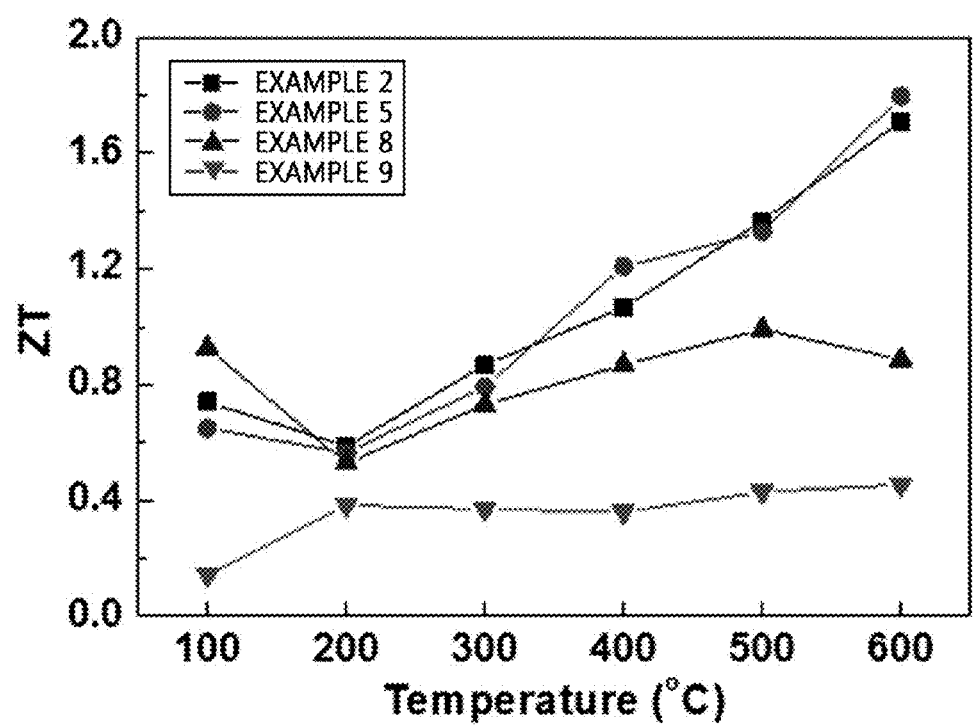
FIG. 20 is a graph illustrating a comparison of ZT value measurement results based on temperature for thermoelectric materials according to different exemplary embodiments of the present disclosure, manufactured by different synthesis methods.

FIGS. 18 through 20 are graphs illustrating a comparison of measurement results of a lattice thermal conductivity ($\kappa_L$), a power factor (PF), and a ZT value based on temperature for example 2, example 5, example 8, and example 9.

First, in FIG. 18, the lattice thermal conductivity was calculated using the Wiedemann-Franz Law, and in this instance, the Lorenz number used was $1.86*10^{-8}$. More specifically, the lattice thermal conductivity may be calculated using the following mathematical formula:

$$\kappa_L = \kappa_{total} - \kappa_e$$

Here, $\kappa_L$ denotes the lattice thermal conductivity, $\kappa_{total}$ denotes the thermal conductivity, and $\kappa_e$ denotes the thermal conductivity to the electrical conductivity. Also, $\kappa_e$ may be expressed as below:

$$\kappa_e = \sigma L T$$

Here, σ denotes the electrical conductivity, and L denotes the Lorenz number and represents 1.86 E-8. Also, T denotes the temperature (K).

Referring to the result of FIG. 18, it can be seen that the lattice thermal conductivity of examples 2 and 5 synthesized by an SSR method is lower than that of examples 8 and 9 synthesized by a melting method. Particularly, when comparing examples 2 and 8 of the same composition, a lattice thermal conductivity change pattern based on temperature is similar, but in the case of example 2, the lattice thermal conductivity is found remarkably low in the entire temperature range of 100° C. to 600° C., compared to example 8. Also, when comparing example 5 and example 9 of the same composition, the lattice thermal conductivity of example 5 by an SSR method is lower than the lattice thermal conductivity of example 9 in the temperature range of 200° C. to 600° C., and moreover, it is found that as the temperature increases, its difference increases.

Next, referring to the result of FIG. 19, it can be seen that the power factor (PF) of example 2 and example 5 synthesized by an SSR method is higher than that of example 8 and example 9 synthesized by a melting method. Particularly, when comparing example 2 and example 8 of the same composition, example 2 based on an SSR method is found higher in power factor than example 8 based on a melting method in the entire temperature measurement range of 100° C. to 600° C. Also, when comparing example 5 and example 9 of the same composition, example 5 is found higher than example 9 in the entire temperature measurement range of 100° C. to 600° C.

Finally, referring to the result of FIG. 20, it can be seen that the ZT of example 2 and example 5 synthesized by an SSR method is higher than that of example 8 and example 9 synthesized by a melting method. Particularly, when comparing example 2 and example 8 of the same composition, example 2 based on an SSR method is found higher in ZT than example 8 based on a melting method in the temperature measurement range of 200° C. to 600° C. Also, when comparing example 5 and example 9 of the same composition, example 5 is found higher than example 9 in the entire temperature measurement range of 100° C. to 600° C.

Considering this comprehensively, in the case of the thermoelectric material according to the present disclosure, synthesis by an SSR method may include more Cu-containing nano-dots, particularly, INDOT than synthesis by a melting method, leading to high thermoelectric performance.

Hereinabove, the present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. A thermoelectric material comprising:
   a matrix represented by a chemical formula $Cu_xSe$, where x is $1.8 < x \leq 2.6$; and
   Cu-containing nano-particles disposed at grain boundaries of the matrix, the Cu-containing nanoparticles comprising a majority of Cu;
   wherein portions of the Cu-containing particles aggregate with each other in a plurality of groups disposed at the grain boundaries.

2. The thermoelectric material according to claim 1, wherein the Cu-containing particles are an induced nano-dot (INDOT).

3. The thermoelectric material according to claim 1, wherein the Cu-containing particles include at least one of Cu particles and $Cu_2O$ particles.

4. The thermoelectric material according to claim 1, wherein the thermoelectric material is manufactured by a manufacturing method comprising:
   forming a mixture by weighing Cu and Se based on the following chemical formula 1 and mixing Cu and Se; and
   forming a compound by thermally treating the mixture:
   <Chemical Formula 1>
   $Cu_xSe$ where x is $2 < x \leq 2.6$.

5. The thermoelectric material according to claim 4, wherein the manufacturing method further comprises pressure sintering the compound after forming the compound.

6. The thermoelectric material according to claim 5, wherein the Cu-containing particles are spontaneously formed during the sintering.

7. The thermoelectric material according to claim 4, wherein the forming of the mixture comprises mixing Cu and Se in powder form.

8. The thermoelectric material according to claim 4, wherein the forming of the compound is performed by a solid state reaction method.

9. A thermoelectric conversion element comprising a thermoelectric material according to claim 1.

10. A thermoelectric power generator comprising a thermoelectric material according to claim 1.

11. The thermoelectric material according to claim 1, wherein a ZT value of the material at 500° C. is greater than 0.6.

12. The thermoelectric material according to claim 1, wherein a ZT value of the material at 500° C. is from 0.6 to 1.4.

13. The thermoelectric material according to claim 1, wherein a ZT value of the material at 300° C. is from 0.6 to 0.8.

14. The thermoelectric material according to claim 13, wherein a ZT value of the material at 600° C. is from 1.4 to 1.7.

15. The thermoelectric material according to claim 1, wherein a ZT value of the material at 600° C. is from 1.4 to 1.7.

16. A thermoelectric material comprising:
   a matrix represented by a chemical formula $Cu_xSe$, where x is $1.8<x\leq2.6$; and
   Cu-containing nano-particles disposed at grain boundaries of the matrix, the Cu-containing nanoparticles comprising a majority of Cu;
   wherein a ZT value of the material at 500° C. is from 0.6 to 1.4.

* * * * *